(12) United States Patent
Arai

(10) Patent No.: US 9,205,396 B2
(45) Date of Patent: Dec. 8, 2015

(54) MICROFLUIDIC DEVICE

(75) Inventor: Susumu Arai, Tokyo (JP)

(73) Assignee: SUMITOMO BAKELITE CO., LTD., Tokyo (JP)

(*) Notice: Subject to any disclaimer, the term of this patent is extended or adjusted under 35 U.S.C. 154(b) by 383 days.

(21) Appl. No.: 13/131,356

(22) PCT Filed: Nov. 26, 2009

(86) PCT No.: PCT/JP2009/006373
§ 371 (c)(1),
(2), (4) Date: May 26, 2011

(87) PCT Pub. No.: WO2010/061598
PCT Pub. Date: Jun. 3, 2010

(65) Prior Publication Data
US 2011/0253222 A1    Oct. 20, 2011

(30) Foreign Application Priority Data

Nov. 26, 2008  (JP) ................................. 2008-300622
May 26, 2009  (JP) ................................. 2009-126405

(51) Int. Cl.
*B01L 3/00* (2006.01)
*B81B 1/00* (2006.01)
(Continued)

(52) U.S. Cl.
CPC ............ *B01J 19/0093* (2013.01); *B01F 5/0646* (2013.01); *B01F 5/0647* (2013.01); *B01F 13/0059* (2013.01); *B01F 15/0203* (2013.01); *B01F 15/0234* (2013.01); *B01L 3/50273* (2013.01); *B01L 3/502776* (2013.01); *B81B 1/00* (2013.01); *B01J 2219/0086* (2013.01);
(Continued)

(58) Field of Classification Search
USPC ....................... 422/502–562; 137/1
See application file for complete search history.

(56) References Cited

U.S. PATENT DOCUMENTS 6,743,399 B1 * 6/2004 Weigl et al. .................... 422/504
6,877,892 B2 * 4/2005 Karp .............................. 366/341
(Continued)

FOREIGN PATENT DOCUMENTS

JP    2000 042402    2/2000
JP    2001 165939    6/2001
(Continued)

OTHER PUBLICATIONS

International Search Report issued Jan. 12, 2010 in PCT/JP09/006373 filed Nov. 26, 2009.

*Primary Examiner* — Lyle Alexander
*Assistant Examiner* — Jennifer Wecker
(74) *Attorney, Agent, or Firm* — Oblon, McClelland, Maier & Neustadt, L.L.P.

(57) ABSTRACT

The present invention is to provide a microfluidic device capable of allowing a fluid to stably flow in a microchannel without using an external source such as a pump or a suction device, and the microfluidic device, provided with a microchannel to which a sample liquid is transported, includes: an inlet reservoir which reserves a sample liquid to be introduced into said microchannel; an inlet which is provided on a sample-introduced side of the microchannel, and communicates with the inlet reservoir; an outlet provided on a sample-discharged side of the microchannel; and an open channel which is provided as communicating with the outlet, and part of at least one surface of which is opened to the outside atmosphere, wherein the inlet is provided at a higher position in a gravity direction than the outlet.

20 Claims, 10 Drawing Sheets

(51) Int. Cl.
  *B01F 5/06* (2006.01)
  *B01J 19/00* (2006.01)
  *B01F 13/00* (2006.01)
  *B01F 15/02* (2006.01)

(52) U.S. Cl.
  CPC .......... *B01J2219/00907* (2013.01); *B01J 2219/00984* (2013.01); *B01L 3/502707* (2013.01); *B01L 2200/0636* (2013.01); *B01L 2200/10* (2013.01); *B01L 2300/0867* (2013.01); *B01L 2300/0874* (2013.01); *B01L 2300/0883* (2013.01); *B01L 2300/161* (2013.01); *B01L 2400/0406* (2013.01); *B01L 2400/0457* (2013.01); *B81B 2201/051* (2013.01); *Y10T 137/0318* (2015.04)

(56) References Cited

U.S. PATENT DOCUMENTS

| | | | |
|---|---|---|---|
| 7,347,617 B2* | 3/2008 | Pugia et al. | 366/341 |
| 7,501,245 B2* | 3/2009 | Quake et al. | 435/6.1 |
| 2002/0143437 A1* | 10/2002 | Handique et al. | 700/266 |
| 2003/0104466 A1* | 6/2003 | Knapp et al. | 435/6 |
| 2003/0165812 A1* | 9/2003 | Takayama et al. | 435/4 |
| 2006/0163385 A1* | 7/2006 | Link et al. | 239/424 |
| 2007/0077185 A1* | 4/2007 | Ueyama et al. | 422/129 |
| 2007/0202015 A1* | 8/2007 | Bousse et al. | 422/100 |
| 2009/0197977 A1* | 8/2009 | Haeberle et al. | 516/10 |
| 2011/0120562 A1* | 5/2011 | Tan et al. | 137/1 |

FOREIGN PATENT DOCUMENTS

| | | | | |
|---|---|---|---|---|
| JP | 2001165939 A * | 6/2001 | | G01N 35/08 |
| JP | 2004 150980 | 5/2004 | | |
| JP | 2005 000744 | 1/2005 | | |
| JP | 2005 270925 | 10/2005 | | |
| JP | 2006 320829 | 11/2006 | | |
| JP | 2007 098223 | 4/2007 | | |
| JP | 2007 268486 | 10/2007 | | |
| JP | 2008 082961 | 4/2008 | | |
| JP | 2008 203003 | 9/2008 | | |
| WO | 03 008102 | 1/2003 | | |

* cited by examiner

GRAVITY DIRECTION

GRAVITY DIRECTION

MICROFLUIDIC DEVICE

TECHNICAL FIELD

The present invention relates to a microfluidic device with a microfluid controlling mechanism, which is formed with structures of a fine channel, a reaction vessel, an electrophoresis column, a membrane separation mechanism, and the like. Specifically, the present invention relates to a microfluidic device which is useful as: a microreaction device (microreactor) broadly used in chemistry, biochemistry, and the like; a microanalysis devices such as an integrated DNA analysis device, a microelectrophoresis device and a microchromatography device; a micro device for preparing an analysis sample such as a volume spectrum and a liquid chromatography; a physicochemical processing device for extraction, membrane separation and dialysis; and some other device.

BACKGROUND ART

Recently, studies have been actively made on microminiaturization of chemical reactions and a separation systems making use of a microprocessing technique, which are called a microreactor and a micrototal analysis system (μTAS). They are expected for applications to analysis and synthesis of nucleic acids, proteins, sugar chains and the like; quick analysis of microchemical substances; and high throughput screening of drugs and medicines; which are performed on a microchip having a microchannel.

Microminiaturization merits of such a system include: (1) being able to reduce a used amount and a disposed amount of a sample and a reagent which are used in chemical reactions and antigen-antibody reactions; (2) being able to reduce a power source required for a process; (3) being able to realize thermal transport and substance transport at high rates by improvement in ratio of a surface area to a volume, resulting in that accurately control of reaction and separation, high rate and high efficiency, and side reaction suppression are expected; (4) being able to simultaneously treat a large number of samples on the same one substrate; and (5) being able to perform on the same substrate from sampling to detection, and realization of a small-footprint, portable and low-priced system is considered.

On the other hand, demerits include: (1) that there are many cases where detection sensitivity deteriorates due to a decrease in a detected area; (2) that it is difficult to generate a turbulence in a fluid flow of a microscale, and it takes time to mix a reagent or the like due to occurring diffused mixing; (3) that a method for highly accurately transport a liquid in minute amount is required for transport the reagent and the like to a fine channel; and (4) that in the case of occurrence of bubbles or the like it is difficult to remove them because an effect of a surface tension is significant, and a large adverse effect is often exerted upon a measurement system. While there are such merits and demerits, a microfluidics technique has been studied, and has been seen in our daily life, in such forms as: an acceleration sensor, a pressure sensor, a position sensor (gyroscope) and the like in the automobile industry field, a light guide, a light switch, a mirror, a lens and the like in the telecommunications industry field; and applications of a blood analysis, a DNA analysis, scientific criminal investigation in the life science industrial field. Besides, the applications are further expanded to the food field, the environmental test field, and the military field.

As microfluidics techniques currently under development, reports have been made on an enzyme or antigen-antibody reaction, an ion-sensitive field-effect transistor (ISFET), a microelectrode, a microcantilever, and a microsensor making use of an acoustic wave and resonance, many of which are sensor applications. As applications, a number of reports have been made on a microelectrophoresis chip, a micro-PCR (Polymerase Chain Reaction) chip, a microgas chromatography chip, a microliquid chromatography chip, a DNA separation chip, and the like. Further, a report has been made on development of a lab-on-a-chip that makes implementation from sampling to analysis on the same chip, and examples thereof include: a multifunctional biochip using a peculiar nucleic acid or antibody for anthrax or bacillus; a portable measurement apparatus that monitors glucose, lactose and the like; a clinical test chip using the antigen-antibody reaction.

In the microfluidic device as described above, a back-pressure type pump is often used as a liquid transport mechanism, and a plunger pump, a peristaltic pump, a syringe pump or the like is used. Further, in a system of performing capillary electrophoresis, an electroosmotic flow is chiefly used. Moreover, by making full use of microprocessing, there have been developed and presented a pump formed by combination of a piezoelectric element and a diaphragm, and further, a diffuser type pump making use of asymmetry of channels. Furthermore, there are methods such as a liquid transport method making use of centrifugal force and an ink-jet liquid transport method. However, since the method for highly accurately transporting a liquid in minute amount is required for transporting a reagent or the like to a fine channel, there has been a problem in that the liquid transport mechanism is large in size or high-priced as compared with a microchannel chip. In point-of-care applications where portability is required, applications of environment or food analysis, and disposable applications often seen in the biological and biochemical fields, where a portion touched by a sample is not reused for avoiding contamination, the liquid transport mechanism is also required to be simple and low-priced, and hence there have been used a liquid transport method making use of capillarity phenomenon or surface tension, or a liquid transport method by means of a fall method making use of gravity.

As the liquid transport method using capillarity phenomenon, paper immuno chromatography and immuno chromatography have already been utilized in many fields. However, since it is the method using a membrane, there are limitations in such fields of use as control of a liquid transport rate and taking-out of a transported liquid. As the liquid transport method making use of surface tension, there has been devised a microliquid droplet transport device provided with a channel made up of a hydrophilic surface and a hydrophobic surface, where a value obtained by dividing the hydrophilic surface by the hydrophobic surface is continuously increased from the upstream toward the downstream so as to transport the liquid in one direction (see Patent Document 1). According to the microliquid droplet transport device, the liquid is transported along the channel due to the gradual increase in ratio of the hydrophilic property from the upstream toward the downstream.

Similarly, there have been devised a microchannel system and a liquid transport device where a channel is formed by a hydrophilic area and a hydrophobic area, and a liquid is transported along the channel (see Patent Documents 2 and 3). The liquid transport method making use of surface tension requires minute and accurate processing of the hydrophilic area and the hydrophobic area, which is industrially problematic method. As the fall method making use of gravity, there have been devised methods making use of pressure attributed to a height difference in a gravity direction between liquid surfaces of an inlet reservoir and an outlet reservoir which are connected through the channel (see Patent Documents 4 and 5). However, stable control of a flow rate is difficult under the influence of surface tension, and it has been a challenge to provide a microfluidic device capable of allowing a fluid to stably flow in a microchannel without using an external source such as a pump or a suction device.

RELATED DOCUMENTS

Patent Documents

Patent Document 1: Japanese Laid-open patent publication NO. 2005-744
Patent Document 2: Japanese Laid-open patent publication NO. 2005-270925
Patent Document 3: Japanese Laid-open patent publication NO. 2000-42402
Patent Document 4: Japanese Laid-open patent publication NO. 2001-165939
Patent Document 5: WO 2003/008102

DISCLOSURE OF THE INVENTION

Technical Problem

An object of the present invention is to provide a microfluidic device capable of allowing a fluid to stably flow in a microchannel without using an external source such as a pump or a suction device.

Solution to Problem

The present invention is as follows.
(1) A microfluidic device provided with a microchannel to which a sample liquid is transported, the device including:
    an inlet reservoir which reserves a sample liquid to be introduced into the microchannel;
    an inlet which is provided on a sample-introduced side of the microchannel, and communicates with the inlet reservoir;
    an outlet provided on a sample-discharged side of the microchannel; and
    an open channel which is provided as communicating with the outlet, and part of at least one surface of which is opened to the outside atmosphere,
    wherein the inlet is provided at a higher position in a gravity direction than the outlet.
(2) The microfluidic device described in (1), wherein a pressure loss adjustment channel for adjusting a flow rate of a fluid is provided between the inlet and the open channel.
(3) The microchannel described in (1) or (2), wherein a plurality of microchannels are placed in parallel.
(4) The microfluidic device described in any one of (1) to (3), further including an outlet reservoir which is provided as communicating with the outlet, and reserves a sample liquid discharged from the outlet.
(5) The microfluidic device described in any one of (1) to (4), having two or more each of the inlets, the outlets, the microchannels, the inlet reservoirs, and the outlet reservoirs as needed, as well as the pressure loss adjustment channels.
(6) The microfluidic device described in any one of (1) to (5), wherein a sectional shape of the microchannel has a width equal to or larger than 1 μm and equal to or smaller than 1 mm, and a depth equal to or larger than 1 μm and equal to or smaller than 1 mm.
(7) The microfluidic device described in any one of (1) to (6), wherein a contact angle of a surface of the microchannel with respect to water is equal to or less than 60 degrees.
(8) The microfluidic device described in anyone of (1) to (7), wherein the surface of the microchannel is subjected to any treatment of plasma treatment, corona discharge treatment, and surface coating treatment with a hydrophilic polymer.
(9) The microfluidic device described in any one of (1) to (8), wherein the surface of the microchannel is treated by coating with any of polyethylene glycols (PEG), EVAL (EVOH), POVAL (PVOH) and a hydrophilic polymer having as a component a polymer with a phosphorylcholine group.
(10) The microfluidic device described in any one of (4) to (9), wherein a terminal of the open channel reaches the lowest point of the outlet reservoir.
(11) The microfluidic device described in any one of (1) to (10), wherein a base material of the microfluidic device is made up of plastic.
(12) The microfluidic device as described in any one of (1) to (11), wherein the inlet, the outlet, the microchannel, the inlet reservoir, and the outlet reservoir as needed, as well as the pressure loss adjustment channel, are formed of a plurality of base materials in a multilayer structure.
(13) The microfluidic device described in any one of (1) to (12), wherein a bioactive substance containing at least one of a nucleic acid, a protein, a sugar chain, and a glycoprotein is fixed or included in part of the microchannel.
(14) A method for using a microfluidic device, wherein, by use of the microfluidic device described in any one of (1) to (13), two or more kinds of fluids are brought into contact, thereby to perform reaction, detection, extraction, separation, condensation or selection.
(15) A method for using a microfluidic device, wherein the microfluidic device described in any one of (1) to (13) is placed in an inclined manner so as to have an angle of inclination with respect to a horizontal direction, and then used.

Advantageous Effects of Invention

According to the present invention, it is possible to obtain a microfluidic device capable of allowing a fluid to stably flow in a microchannel by having a simple structure, without using an external source such as a pump or a suction device.

DESCRIPTION OF EMBODIMENTS

Hereinafter, embodiments of the present invention will be described using the drawings.

Figure 1:
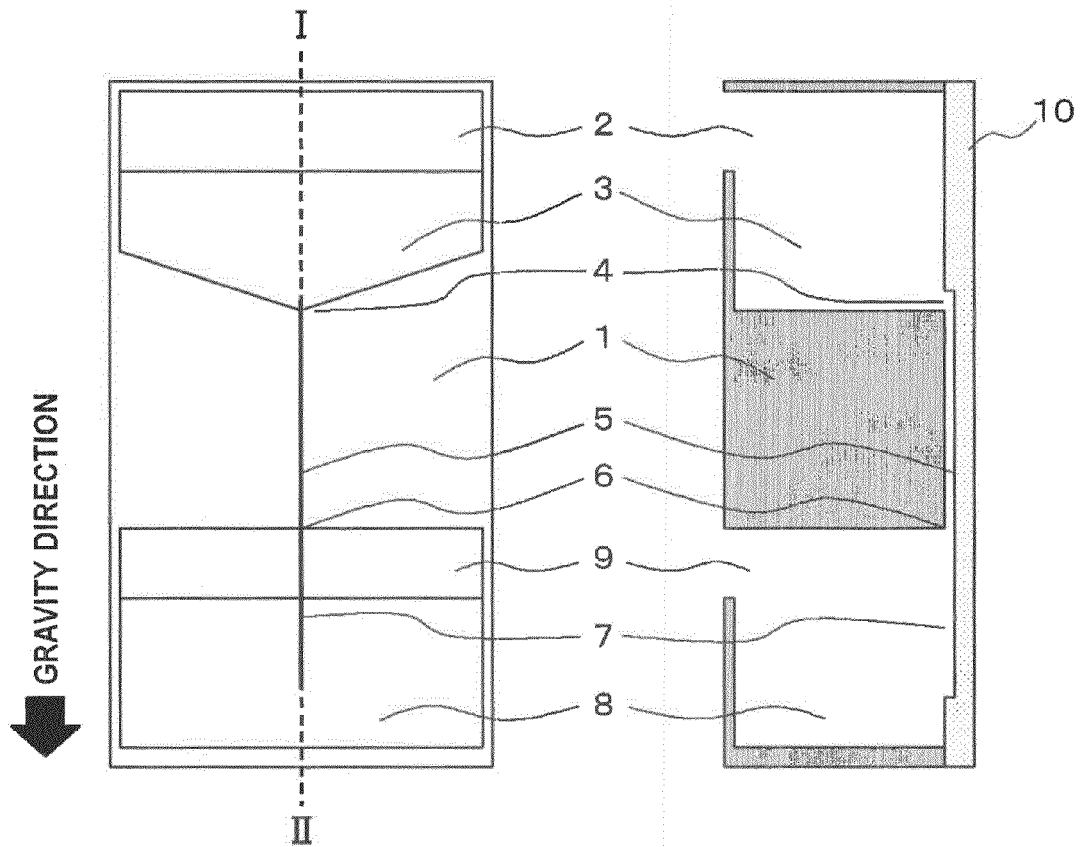
FIG. 1 is a schematic front view and a sectional view in a direction I-II of a first embodiment of a microfluidic device of the present invention.

FIG. 1 shows a schematic front view and a sectional view in a direction I-II of an example (first embodiment) of a microfluidic device of the present invention. The microfluidic device shown in FIG. 1 includes: a sample inlet 2 for introduction of a sample formed by a first base material 1 and a second base material 10; an inlet reservoir 3 in which the sample is reserved; an inlet 4 through which the sample is introduced into a microchannel; a microchannel 5 in which the sample flows; an outlet 6 through which the sample flows out of the microchannel; an open channel 7 which guides the sample flown out of the outlet in a gravity direction, and a side surface of which is opened to the atmosphere; an outlet reservoir 8 in which the sample having passed through the channel is reserved as necessary; and a sample recovery port 9 which recovers the sample from the outlet reservoir.

Figure 10:
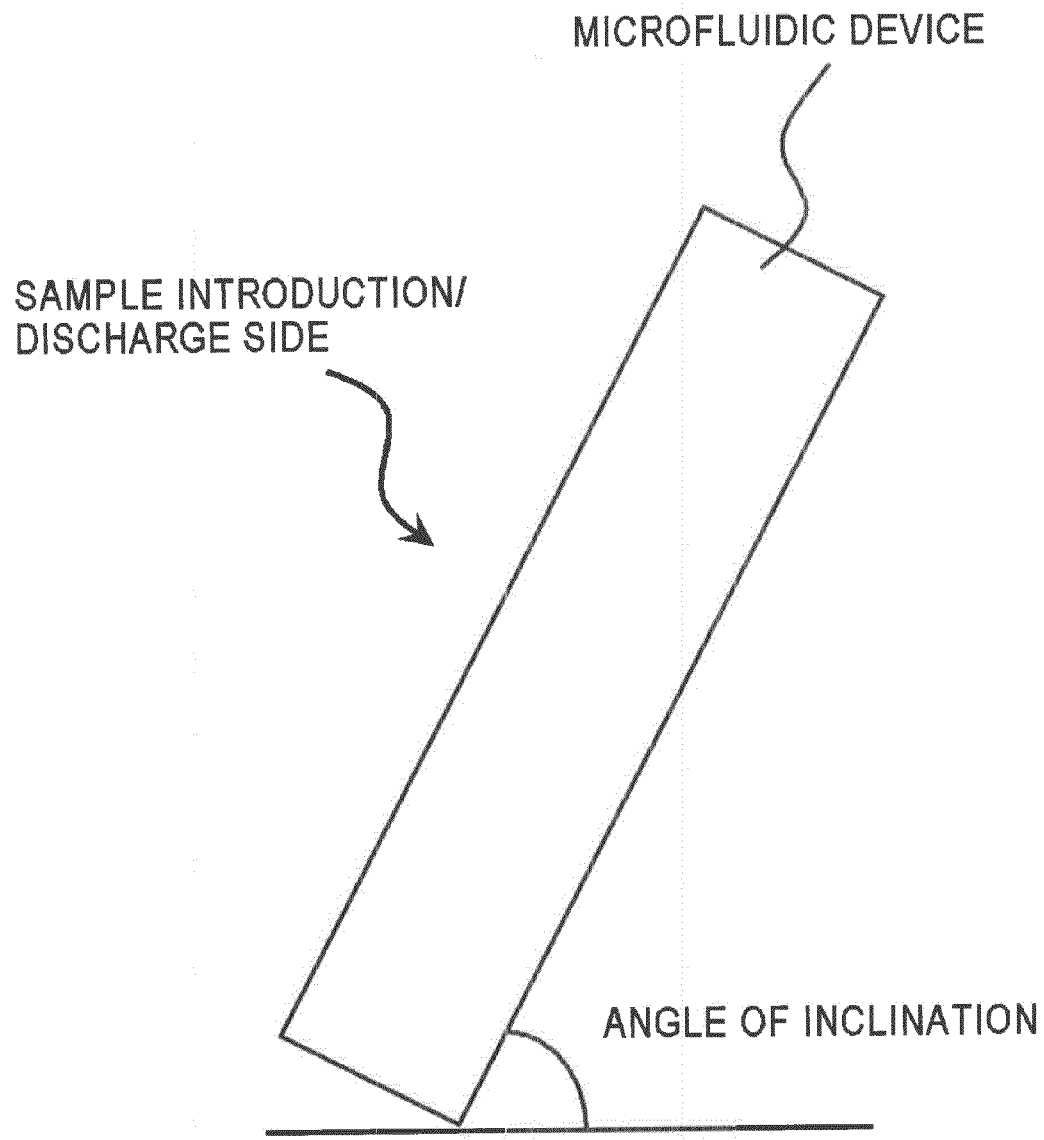
FIG. 10 is a schematic view showing an aspect of using the microfluidic device in an inclined manner.

By use of the microfluidic device shown in FIG. 1, a sample introduced from the sample inlet 2 is reserved in the inlet reservoir 3, and the sample flows in the microchannel 5 with gravity acting as driving force, flows through the open channel 7, and is reserved in the outlet reservoir 8. For example, a DNA, an antibody, a sugar chain or the like, which reacts specifically with a component in a sample, is fixed to the microchannel, and thereby, the component in the sample can be captured. The captured component is labeled by means of a fluorescent label, chemiluminescence or the like, and thereby, the component in the sample can be evaluated. Further, an unnecessary component in the sample is captured inside the microchannel, and thereby, the refined sample is reserved in the outlet reservoir, and can be recovered from the sample recovery port 9. Moreover, the microfluidic device shown in FIG. 1 is placed in an inclined manner so as to have an angle of inclination with respect to a horizontal direction as shown in FIG. 10, thereby allowing adjustment of a hydraulic head difference and adjustment of a flow rate of the sample fluid, and the device is then used.

Figure 2:
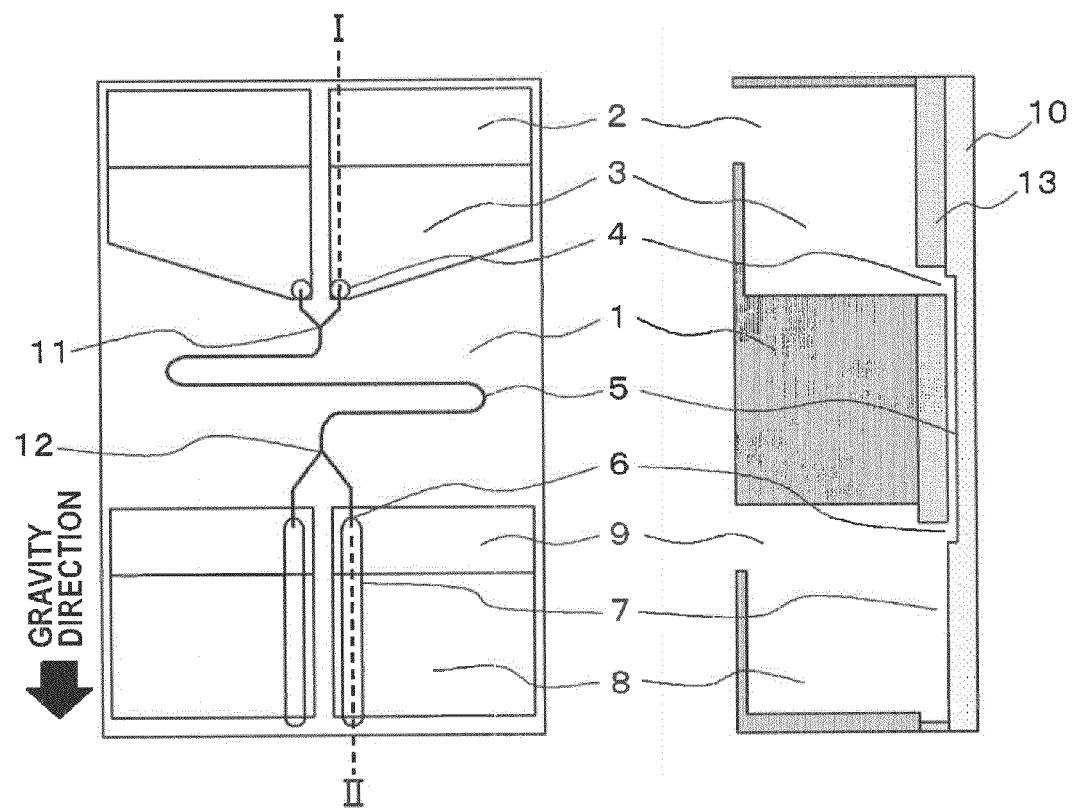
FIG. 2 is a schematic front view and a sectional view in a direction I-II of a second embodiment of the microfluidic device of the present invention.

FIG. 2 shows a schematic front view and a sectional view in a direction I-II of an example (second embodiment) of the microfluidic device of the present invention. The microfluidic device shown in FIG. 2 includes: two sample inlets 2 for introduction of samples formed by the first base material 1 and a third base material 13; two inlet reservoirs 3 in which the samples are reserved; two outlet reservoirs 8 in which the samples having passed through the channel are reserved as necessary; two sample recovery ports 9 which recover the samples from the outlet reservoirs; two inlets 4 through which samples formed by the second base material 10 and the third base material 13 are introduced into the microchannel; the microchannel 5 in which the samples flow from the two inlets, merge, and then branch; two outlets 6 through which the samples flow out of the microchannel; and two open channels 7 which guide the samples flown out of the outlets in the gravity direction, and side surfaces of which are opened to the atmosphere.

By use of the microfluidic device shown in FIG. 2, two samples introduced from the two sample inlets 2 are reserved in the two inlet reservoirs 3, and the samples flow from the two inlets 4 in the microchannel 5 with gravity acting as driving force, and merge; the sample having merged becomes a laminar flow and flows inside the microchannel; and the sample having flown in the state of the laminar flow is branched by a branched channel, and discharged from the two outlets 6 to flow through the open channels 7, and are reserved in the outlet reservoirs 8. Making use of the laminar flows of the two samples in contact with each other allows extraction, separation and selection. Further, the microfluidic device shown in FIG. 2 is placed in the inclined manner so as to have an angle of inclination with respect to the horizontal direction as shown in FIG. 10, thereby allowing adjustment of the hydraulic head difference and adjustment of the flow rate of the sample fluid, and the device is then used.

Figure 3:
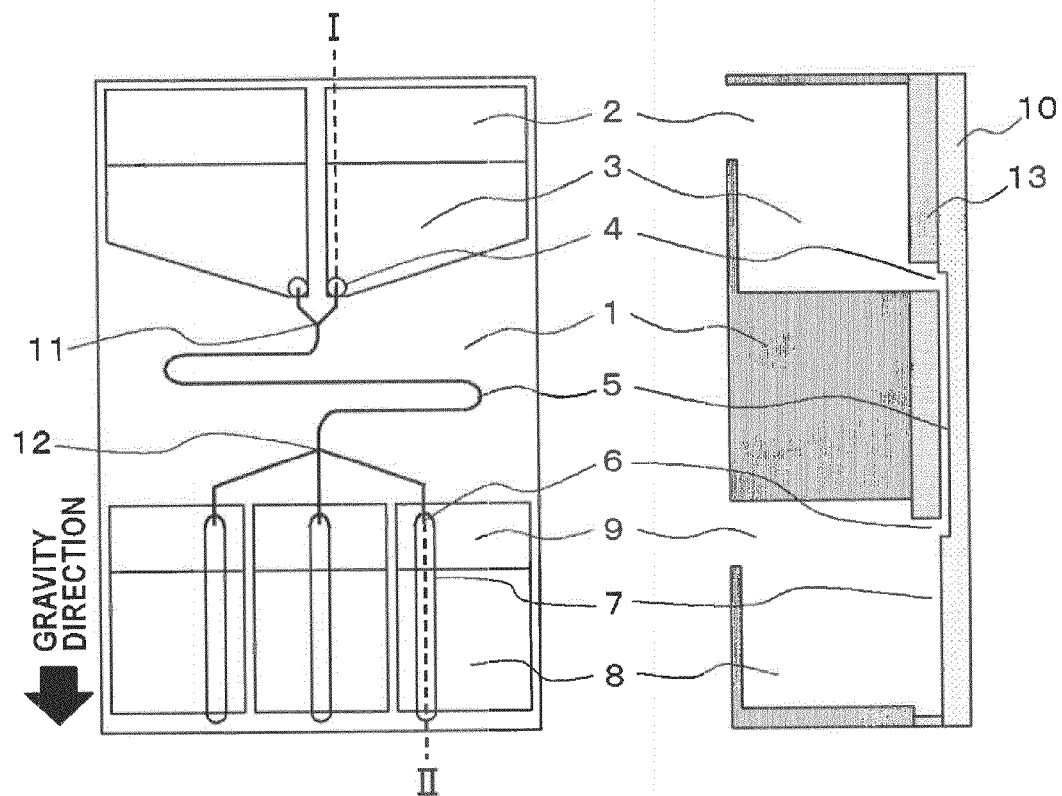
FIG. 3 is a schematic front view and a sectional view in a direction I-II of a third embodiment of the microfluidic device of the present invention.

FIG. 3 shows a schematic front view and a sectional view in a direction I-II of an example (third embodiment) of the microfluidic device of the present invention. The microfluidic device shown in FIG. 3 includes: the two sample inlets 2 for introduction of samples formed by the first base material 1 and the third base material 13; the two inlet reservoirs 3 in which the samples are reserved; three outlet reservoirs 8 in which the samples having passed through the channel are reserved as necessary; three sample recovery ports 9 which recover the samples from the outlet reservoirs; two inlets 4 through which samples formed by the second base material 10 and the third base material 13 are introduced into the microchannel; the microchannel 5 in which the samples flow from the two inlets, merge, and then branch into three; three outlets 6 through which the samples flow out of the microchannel; and three open channels 7 which guide the samples flown out of the outlets in the gravity direction, and side surface of which are opened to the atmosphere.

By use of the microfluidic device shown in FIG. 3, two samples introduced from the two sample inlets 2 are reserved in the two inlet reservoirs 3, and the samples flow from the two inlets 4 in the microchannel 5 with gravity acting as driving force, and merge; the sample having merged becomes the laminar flow and flows inside the microchannel; and the sample having flown in the state of the laminar flow is branched by a channel branched into three, discharged from the three outlets 6 to flow through the open channels 7, and are reserved in the outlet reservoirs 8. By reaction of the two samples in contact with each other on the interface of the laminar flows of the two samples, the reacted portion can be recovered in the central outlet reservoir 8. Further, the microfluidic device shown in FIG. 3 is placed in the inclined manner so as to have an angle of inclination with respect to the horizontal direction as shown in FIG. 10, thereby allowing adjustment of the hydraulic head difference and adjustment of the flow rate of the sample fluid, and the device is then used.

Figure 4:
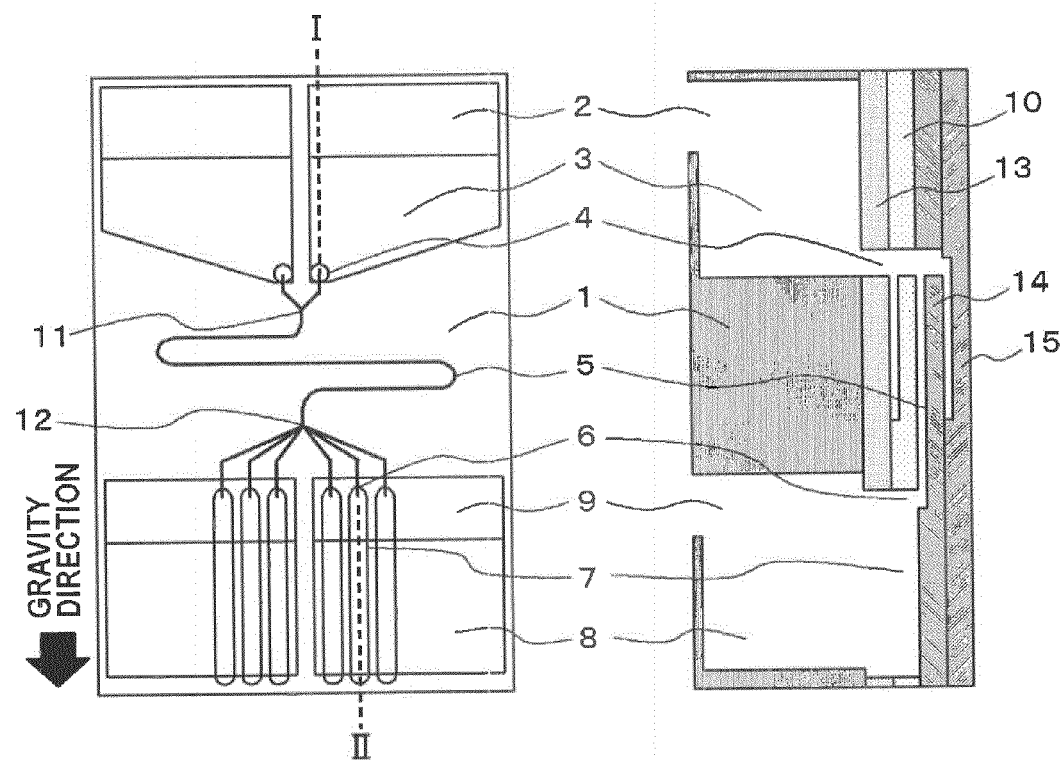
FIG. 4 is a schematic front view and a sectional view in a direction I-II of a fourth embodiment of the microfluidic device of the present invention.

FIG. 4 shows a schematic front view and a sectional view in a direction I-II of an example (fourth embodiment) of the microfluidic device of the present invention. The microfluidic device shown in FIG. 4 includes: the two sample inlets 2 for introduction of samples formed by the first base material 1 and the third base material 13; the two inlet reservoirs 3 in which the samples are reserved; two outlet reservoirs 8 in which the samples having passed through the channel are reserved as necessary; two sample recovery ports 9 which recover the samples from the outlet reservoirs; two inlets 4 through which samples formed by the second base material 10 and the third base material 13 are introduced into the microchannel; the microchannel 5 in which the samples flow from the two inlets, merge, and then branch into two; two outlets 6 through which the samples flow out of the microchannel; six open channels 7 which guide the samples flown out of the outlets in the gravity direction, and side surfaces of which are opened to the atmosphere; two inlets 4 through which samples formed by the second base material 10 and a fourth base material 14 are introduced into the microchannel; the microchannel 5 in which the samples flow from the two inlets, merge, and then branch into six; six outlets 6 through which the samples flow out of the microchannel; the six open channels 7 which guide the samples flown out of the outlets in the gravity direction, side surfaces of which are opened to the atmosphere; two inlets 4 through which samples formed by the fourth base material 14 and a fifth base material 15 are introduced into the microchannel; the microchannel 5 in which the samples flow from the two inlets, merge, and then branch into two; the two outlets 6 through which the samples flow out of the microchannel; and the two open channels 7 which guide the samples flown out of the outlets in the gravity direction, side surfaces of which are opened to the atmosphere.

The microfluidic device shown in FIG. 4 is an example of making the multilayered microchannel 5 of the microfluidic device of FIG. 2, and making the microchannel 5 multilayered can improve processing power. This method for making the microchannel multilayered is not a method limited to the microfluidic device of FIG. 4. Further, the microfluidic device shown in FIG. 4 is placed in the inclined manner so as to have an angle of inclination with respect to the horizontal direction as shown in FIG. 10, thereby allowing adjustment of the hydraulic head difference and adjustment of the flow rate of the sample fluid, and the device is then used.

Figure 5:
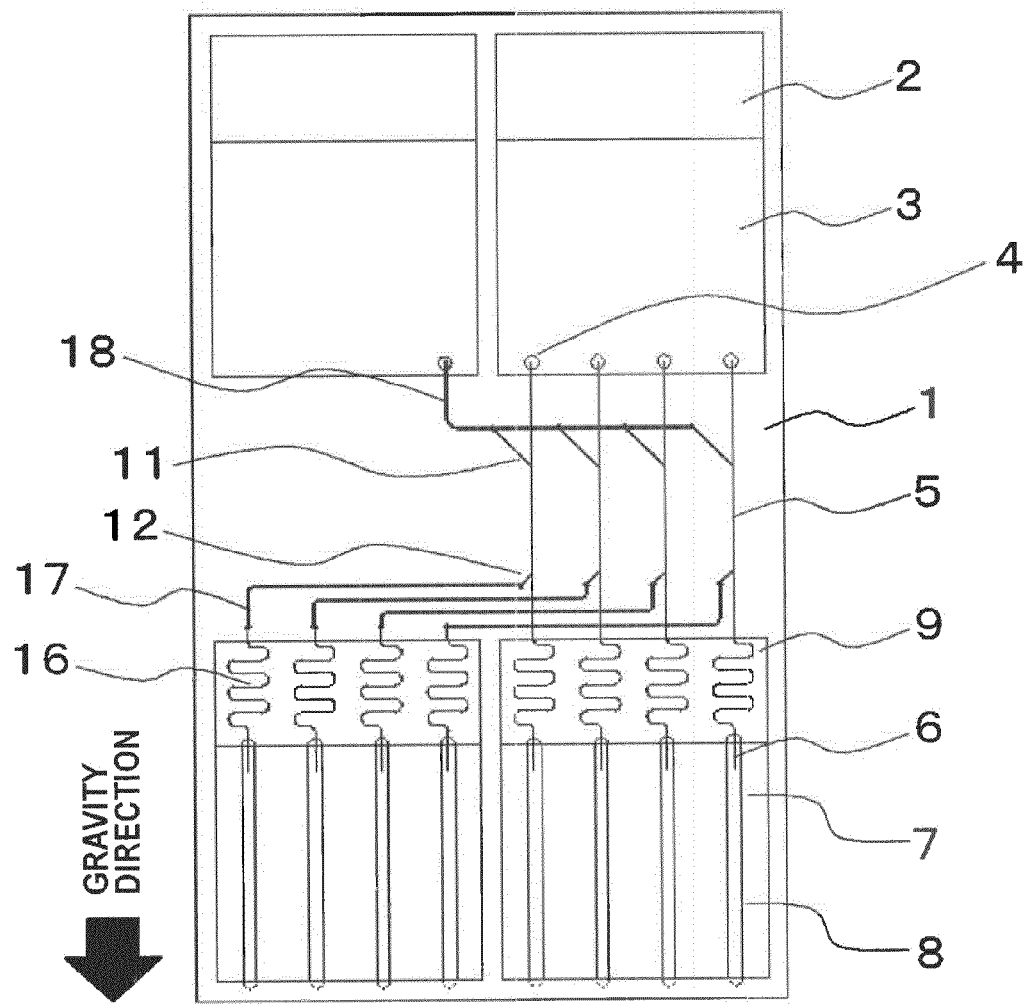
FIG. 5 is a schematic front view of a fifth embodiment of the microfluidic device of the present invention.
Figure 6:
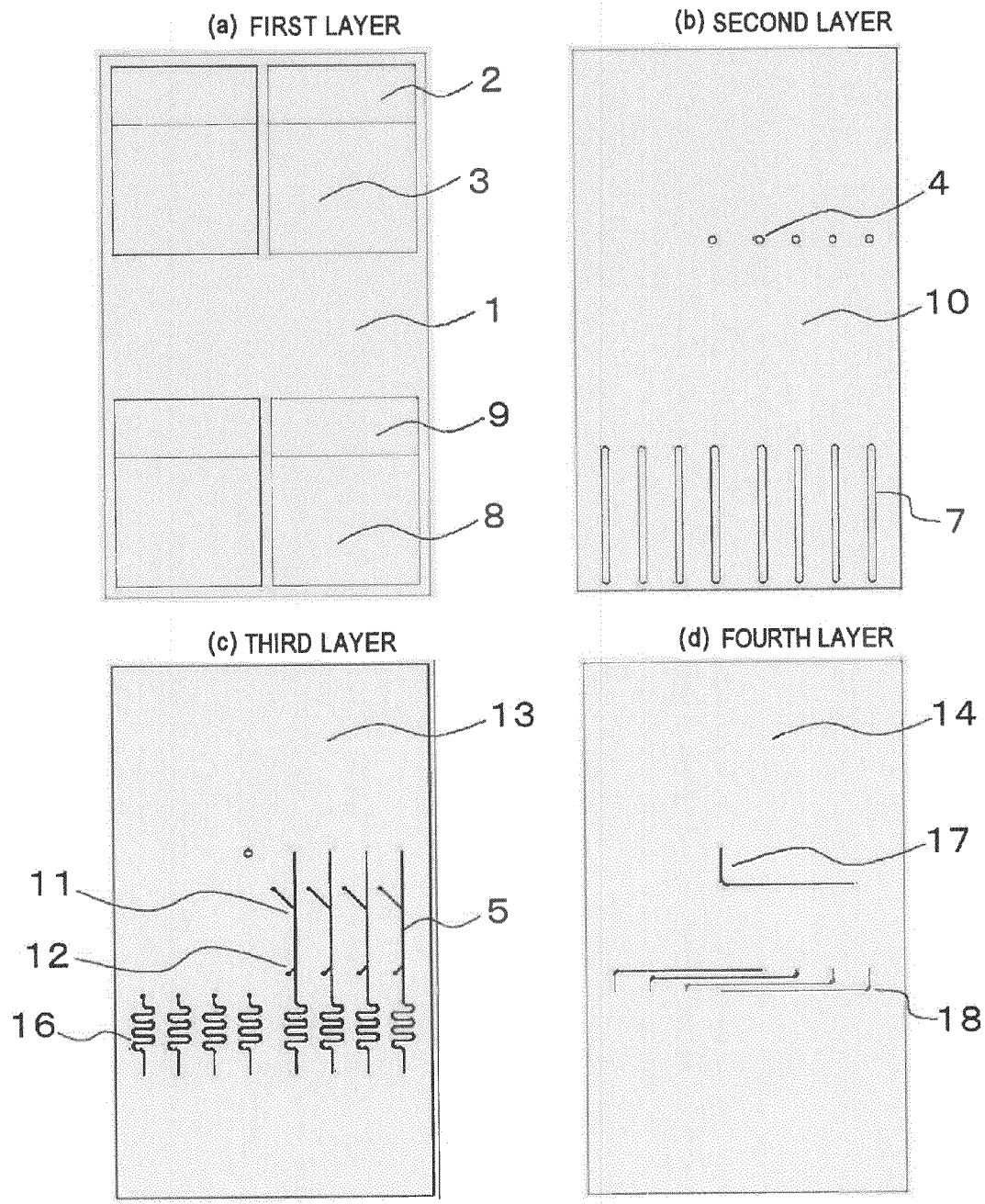
FIG. 6(a) to (d) are layer constituional views of the fifth embodiment of the microfluidic device of the present invention.

FIG. 5 shows a schematic front view of an example (fifth embodiment) of the microfluidic device of the present invention, and FIG. 6 shows constitutional components of four layers of the microfluidic device shown in FIG. 5. The microfluidic device shown in FIG. 5 includes: the two sample inlets 2 for introduction of samples formed by the first base material 1 and the third base material 13; the two inlet reservoirs 3 in which the samples are reserved; the two outlet reservoirs 8 in which the samples having passed through the channel are reserved as necessary; the two sample recovery ports 9 which recover the samples from the outlet reservoirs; five inlets 4 through which samples formed by the second base material 10, the third base material 13 and the fourth base material 14 are introduced into the microchannels; four microchannels 5 in which the samples flow from the five inlets, branch, merge, and then branch into two each; eight pressure loss adjustment channels 16 which adjust flow rates of the samples inside the microchannels; eight outlets 6 through which the samples flow out of the microchannel; and eight open channels 7 which guide the samples flown out of the outlets in the gravity direction, and side surfaces of which are opened to the atmosphere.

A first layer shown in FIG. 6(*a*) is formed of the two sample inlets 2 for introduction of samples, the two inlet reservoirs 3 in which the samples are reserved, the two outlet reservoirs 8 in which the samples having passed through the channel are reserved, and the two sample recovery ports 9 which recover the samples from the outlet reservoirs; a second layer shown in FIG. 6(*b*) is formed of the five inlets 4 through which introduction is made into the micro channels, and the eight open channels 7 which guides the samples flown out of the outlets in the gravity direction, and side surfaces of which are open to the atmosphere; a third layer shown in FIG. 6(*c*) is formed of the four microchannels 5 in which the samples flow from the five inlets, branch, merge, and then branch into two each, and the eight pressure loss adjustment channels 16 which adjust flow rates of the samples inside the microchannels 5; and a fourth layer shown in FIG. 6(*d*) is formed of one distribution channel 17 which introduces one out of the two samples from the inlet and distributes it to the microchannel, and a bypass channel 18 which allows one out of the two fluids, branched by the microchannel, to flow in a direction to the outlet, and thereby joining these four layers constitutes the microfluidic device shown in FIG. 5.

The microfluidic device shown in FIG. 5 is an example of parallelly arranging the four microchannels 5 of the microfluidic device of FIG. 2, and parallelization of the microchannels 5 improves the processing power. This method for parallelization of the microchannels is not a method limited to the microfluidic device of FIG. 5. Further, the microfluidic device shown in FIG. 5 is placed with the pressure loss adjustment channels 16 for adjusting flow rates of the samples inside the microchannels, and the flow rates of the sample fluids are adjusted. Moreover, the microfluidic device shown in FIG. 5 is placed in the inclined manner so as to have an angle of inclination with respect to the horizontal direction as shown in FIG. 10, thereby allowing adjustment of the hydraulic head difference and adjustment of the flow rate of the sample fluid, and the device is then used.

Figure 8:
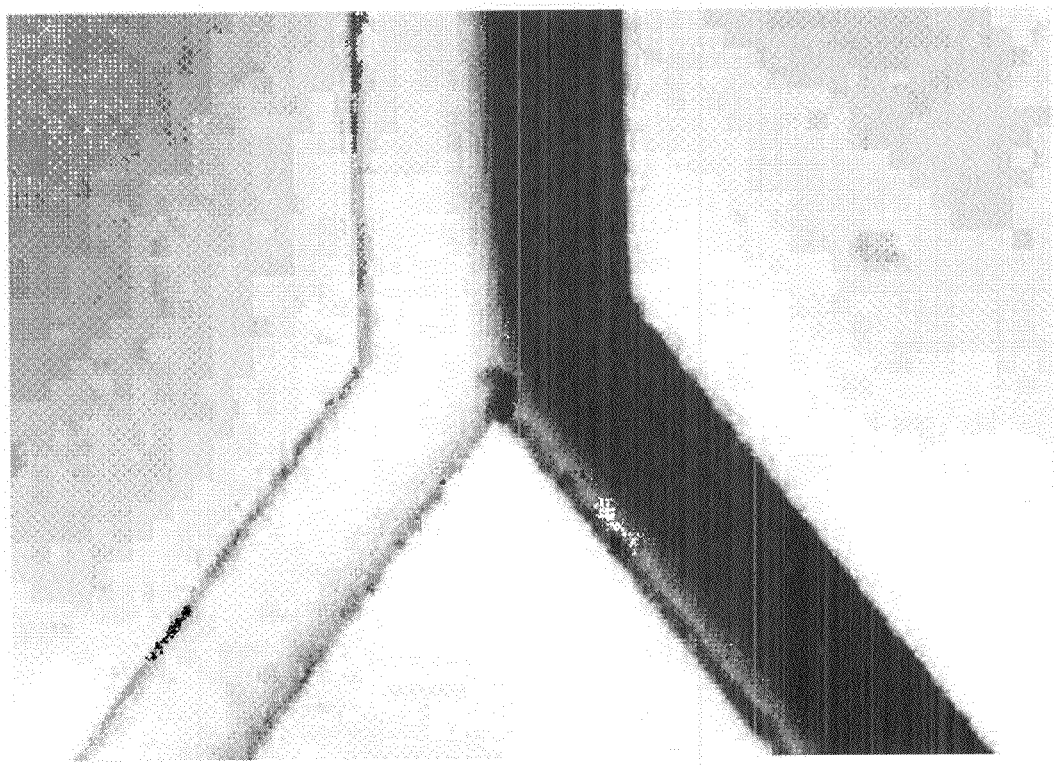
FIG. 8 is a schematic view showing a result of observation of a fluid in a branch section of the microfluidic device produced in Example 2.
Figure 8:

It is to be noted that in the microfluidic devices shown in FIGS. 2 to 5, the samples introduced respectively from the two inlets 4 merge in a channel merging section 11, and as shown in FIG. 8, in the microchannels 5, liquid flows from the respective inlets get together to form a layer, and also flow down to a channel branching section 12 without disturbance of the interface, and the liquid flow then branches. Such a liquid flow in the layer formed in the microchannel 5 is referred to as a "laminar flow". This is a phenomenon which can occur when each of the liquid flows is generated at almost the same rate, and in a liquid transport system by means of capillarity phenomenon, the laminar flow has been hard to realize due to difficulties in control of the rate of each of the liquid flows so as to remain unchanged. Further, it has not been realistic since a device configuration is complicated and high-priced in the liquid transport system using an external source such as a pump or a suction device.

In these embodiments of the present application, since the liquid transport system by means of the fall method using gravity is adopted, the rate of each of the liquid flows spontaneously becomes almost equal even in the simple configuration, allowing formation of the laminar flow from the channel merging section 11 to the channel branching section 12. Further, the samples flowing out of the respective inlets 4 come into contact with each other on the interface of this laminar flow, and substances in the respective samples can be moved between the samples. This allows reaction, detection, extraction, separation concentration and selection of the substances in the samples.

Moreover, while the example of bringing the two kinds of fluids into contact with each other has been shown here, in the case of bringing three or more kinds of fluids into contact with one another, the contact is possible in such a manner that the inlet reservoirs 3 in just the same number as the number of kinds of the fluids are provided, the inlets 4 are respectively provided thereon, and the channels from the inlets 4 are merged into the microchannels 5.

In the microfluidic device shown in FIG. 2, the laminar flow having reached the channel branching section 12 branches into two with the interface taken as a border, and after the branching, the respective liquid flows reach their corresponding outlets 6. In this form, it is possible to independently recover the respective samples after the processing.

Further, in the microfluidic device shown in FIG. 3, the liquid flow branches into three, which are an interface portion and portions on both sides of the interface, and after the branching, the respective liquid flows reach their corresponding outlets 6. In this form, it is possible to independently collect the sample in the interface portion, on top of independently recovering the respective samples after the processing.

Moreover, in the microfluidic device shown in FIG. 4, as for both sides with the interface taken as the border, the laminar flow branches into three on each of the sides and six in total, and after the branching, the respective liquid flows reach their corresponding outlets 6. It should be noted that, while each of the samples branches into three liquid flows after the branching, the number thereof is not limited to three, and the sample can be divided into the same number just as the number of outlets 6 provided, whereby such processing of the samples as described above can be further promptly performed.

Furthermore, in the microfluidic device shown in FIG. 5, the laminar flows are formed in the plurality of microchannels 5, and in each of the microchannels 5, the laminar flow reaches the channel branching section 12, branches into two liquid flows with the interface taken as the border, and after the branching, the respective liquid flows reach their corresponding outlets 6. As the forms of FIGS. 1 to 4, the microchannel 5 is detoured to take a long distance for the samples being in contact with each other so that the time for formation of the laminar flow is made long, and long contact time for the samples is taken, to allow movement efficiency of the substances to be high, whereas in the form shown in FIG. 5, since the plurality of microchannels 5 are formed in the space between the inlet 4 and the outlet 6 and it is difficult in terms of space design to make the lengths of the microchannels 5 large, the pressure loss adjustment channel 16 is provided in each of the channels on the downstream side of the channel branching section 12, thereby to reduce the rate of the liquid flow as described later, and as a consequence, the time for forming the laminar flow is made long, to take long contact time for the samples, and hence an effect similar to those of the forms of FIGS. 2 to 4 can be exerted. It should be noted that in FIG. 5, the pressure loss adjustment channel 16 is provided in the space until the outlet 6 is reached in the channel on the downstream side of the channel branching section 12, but it may be provided in a place other than the above, such as the space from the inlet 4 to the channel merging section 11.

As the mother material for the microfluidic device of the present invention, a material such as glass, silicon, plastic and rubber can be used. The base material is preferably plastic in view of workability and cost efficiency. As a material for plastic, cyclic polyolefin (COC), which has small autofluorescence since a detection method most commonly used at present is fluorescent detection, and has been recognized as a bioactive substance (having no problem even when coming into contact with blood) by FDA, is most preferable in terms of properties including workability and cost efficiency, but a variety of plastic materials can be selected, and the material is selected as appropriate in accordance with applications of a microchip to be produced; processing; a solvent and a bioactive substance to be used; and characteristics of a detection method, in view of formability, thermal resistance, chemical resistance, adsorbability, and the like.

Examples of the plastic material include polystyrene, polyethylene, polyvinyl chloride, polypropylene, polycarbonate, polyester, polymethylmethacrylate, polyvinyl acetate, vinyl-acetate copolymer, styrene-methylmethacrylate copolymer, acrylonitrile-styrene copolymer, acrylonitrile-butadiene-styrene copolymer, nylon, polymethylpentene, silicon resin, amino resin, polysulfone, polyethersulfone, polyetherimide, fluorine resin, and polyimide.

Further, these plastic materials may be mixed as appropriate with an additive such as pigment, dye, antioxidant or fire retardant.

In the present invention, a processing method for processing the inlet, the channel and the like in the base material is not particularly limited, and there can be used methods such as cutting, injection molding, solvent casting, photolithography, laser ablation and hot embossment.

In the present invention, in designing of the microfluidic device, a width, a height and a length of the microchannel, a height difference between the inlet and the outlet, shapes and sizes of the inlet reservoir and the outlet reservoir, a width, a height and a length of the open channel, and the like are designed in view of a processed amount of the flown sample, processing time, reaction time, diffusion time, fluid characteristics, and the like, so that the interface of the laminar flow is not disturbed in the microchannel 5.

A width and a depth of a sectional shape of the microchannel is preferably equal to or larger than 1 µm and equal to or smaller than 1 mm, and further preferably equal to or larger than 5 µm and equal to or smaller than 800 µm. When the width and the depth of the microchannel are below lower limits, a technique is required in production of the microchannel, to prevent industrial production thereof, which is not efficient, and a pressure loss of the microchannel increases with respect to driving force of gravity, to make the flow rate extremely slow, which is not practical. When the width and the depth of the microchannel exceed upper limits, bubbles tend to remain inside the microchannel, or the flow rate of the fluid increases and becomes uncontrollable, which is not preferred. The length of the microchannel is designed from the reaction time, the diffusion time, the flow rate, and the like of the fluid, and when the microchannel is excessively short, the pressure loss of the microchannel is so small as to cause acceleration of the flow rate, making it impossible to take sufficient reaction time and diffusion time. Further, when the channel is excessively long, the pressure loss of the microchannel is so large as to cause deceleration of the flow rate, leading to occurrence of unexpected diffusion of the samples or requiring processing time, which is not efficient.

The pressure loss adjustment channel of the present invention serves to adjust the pressure loss of the sample fluid, so as to adjust the rate of the fluid inside the microchannel. Adjusting the rate of the fluid controls the reaction time, the diffusion time, and the like. The pressure loss adjustment channel is designed as appropriate in view of the characteristics of the sample fluid and the design of the microchannel, so as to adjust the flow rate to a targeted one. Each of the pressure loss adjustment channels does not necessarily have the same design, but can be designed as appropriate based upon the characteristics of the sample fluid and an object of the microfluidic device.

Further, appropriate adjustment of the rate of the sample fluid can stabilize the laminar flow formed in the microchannel 5 such that the interface is not disturbed and the position of the interface remains unchanged.

The open channel in the present invention serves to stably wash away a fluid, flowing with gravity acting as driving force, from the outlet when the fluid flows in the microchannel and then discharged from the outlet. When the fluid flowing with gravity acting as its driving force is discharged from the microchannel, the fluid stays at the outlet or flows, to exert an effect upon the flow inside the microchannel, and therefore, stably removing the fluid from the outlet is an essential condition for stable flowing of the fluid inside the microchannel. Providing the open channel open to the outside atmosphere as communicating with the outlet can stably remove the fluid, staying at the outlet, along the open channel by means of gravity and surface tension. Further, the fluid allowed to flow from the outlet in the gravity direction gets farther from the outlet, and thereby its viscosity becomes less influential, and its tendency to exert an effect upon the fluid inside the microchannel is reduced.

While a width and a depth of the open channel are designed on an as-needed basis depending upon the characteristics of the fluid, those are preferably equal to or larger than 10 μm and equal to or smaller than 3 mm, and more preferably equal to or larger than 20 μm and equal to or smaller than 2 mm. When the width and the depth of the open channel are below lower limits, a technique is required in production of the open channel, to prevent industrial production thereof, which is not efficient, and an effect of surface tension and an effect of viscosity of the fluid increase with respect to driving force of gravity, to reduce the ability to remove the fluid at the outlet, which is not practical. When the width and the depth of the open channel exceed upper limits, surface tension becomes less influential upon the inside of the open channel, to cause the fluid not to stably flow in the open channel, making it impossible to stably remove the fluid from the outlet, which is not preferred.

A length of the open channel (height in the case of making the device independent) is designed in view of the viscosity of the fluid and the like, such that the fluid flowing in the open channel has a small effect upon the microchannel. The length of the open channel (height in the case of making the device independent) is preferably large, and further preferably reaches the lowest point of the outlet reservoir, so as to make the effect exerted upon the microchannel small. By the open channel reaching the lowest point of the outlet reservoir, the length of the open channel (height in the case of making the device independent) can be made the largest among limitations on the designed microfluidic device, and further, reaching the lowest point of the outlet reservoir allows the use of surface tension of the bottom of the outlet reservoir, whereby it is possible to promote further smoother flow of the fluid.

In the present invention, a contact angle of the microchannel with respect to water is equal to or less than 60 degrees, and further preferably equal to or less than 40 degrees. When the contact angle of the microchannel with respect to water is large, bubbles tend to remain in the channel, or driving force due to gravity decreases, thereby requiring the time for flowing of the fluid in the channel, which is not preferred. As a technique for making the contact angle of the microchannel with respect to water equal to or less than 60 degrees, it is preferable to perform plasma discharge treatment, corona discharge treatment, surface coating treatment with a hydrophilic polymer, or surface coating treatment with polyethylene glycols (PEG), EVAL (EVOH), POVAL (PVOH) or a hydrophilic polymer having as a component a polymer with a phosphorylcholine group, but it is not limited so long as being a method not having an ill effect such as changing a constituent or a composition ratio of the fluid.

In the microchannel, a space can be provided where an electrode and a reaction reagent that reacts with a fluid as a reagent are arranged, so as to operate and analyze the fluid.

Channel designing of microfluidic devices by use of these microchannels is performed as appropriate in view of an object to be detected and convenience. It is possible to mount as a microfluidic device a membrane, a valve, a sensor, a motor, a mixer, a gear, a clutch, a microlens, an electric circuit, and to like, or process a plurality of microchannels on the same substrate, so as to make the device multifunctional.

A bioactive substance is fixed to part of the microchannel in the microfluidic device of the present invention. While examples of the bioactive substance include a nucleic acid, a protein, a sugar chain, and a glycoprotein, an optimal bioactive substance can be selected as appropriate in accordance with characteristics of the object to be detected. Further, a plurality of bioactive substances may be fixed onto the same channel, or a different microfluidic device may be produced on the same microfluidic device, and bioactive substances may be separately fixed thereon. In order to fix the bioactive substance to the surface of the microchannel in the microfluidic device, it is also possible to reform the plastic surface, for example, by introduction of a functional group, fixing of a functional material, addition of a hydrophilic property, or the like.

EXAMPLES

Hereinafter, the present invention will be specifically described by means of examples, but it is not limited to these examples.

Example 1

As the first base material 1, a plastic substrate (30 mm wide×80 mm high×3 mm thick) made of cyclic olefin (ZEONOR 1060R, manufactured by ZEON CORPORATION) was used, and by cutting, the sample inlet 2 was produced to be 27 mm wide and 10 mm high, the inlet reservoir 3 be 27 mm wide, 20 mm high and 3 mm deep, the sample recovery port 9 be 27 mm wide and 10 mm high, and the outlet reservoir 8 be 27 mm wide, 20 mm high and 3 mm deep. Further, as the second base material 10, a plastic substrate (30 mm wide×80 mm high×1 mm thick) made of cyclic olefin (ZEONOR 1060R, manufactured by ZEON CORPORATION) was used, and by cutting, the microchannel 5 and the open channel 7 were produced to be 400 μm wide, 200 μm deep and 50 mm high. The above cutting substrates were bonded together by thermo-compression bonding, to produce a microfluidic device with the channel design shown in FIG. 1. Oxygen plasma treatment was implemented as surface treatment, resulting in that a contact angle of the substrate with respect to water was 60 degrees.

1 mL of PBS (manufactured by NIHON PHARMACEUTICAL CO., LTD.) was introduced into the inlet reservoir in the above microfluidic device from a sample inlet, resulting in that the fluid stably flew to the outlet reservoir in about 10 minutes.

Example 2

Figure 7:
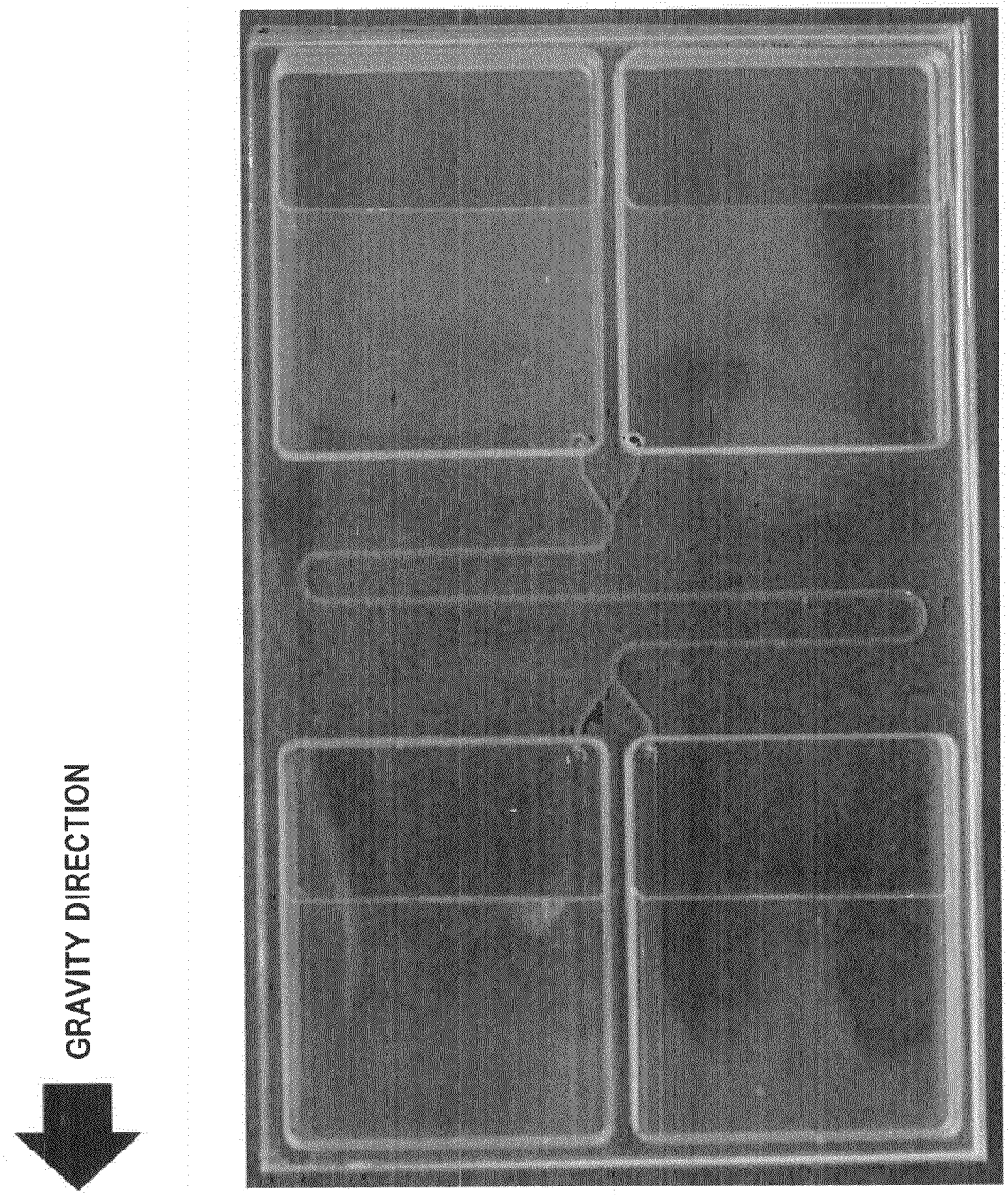
FIG. 7 is a schematic view showing a microfluidic device in the design of FIG. 2 produced in Example 2.

As the first base material 1, a plastic substrate (55 mm wide×80 mm high×6 mm thick) made of cyclic olefin (ZEONEX 480, manufactured by ZEON CORPORATION) was used, and by cutting, the sample inlet 2 was produced to be 25 mm wide and 10 mm high, the inlet reservoir 3 be 25 mm wide, 20 mm high and 6 mm deep, the sample recovery port 9 be 25 mm wide and 10 mm high, and the outlet reservoir 8 be 25 mm wide, 20 mm high and 6 mm deep. Further, as the second base material 10, a plastic substrate (55 mm wide×80 mm high×1 mm thick) made of cyclic olefin (ZEONEX 480, manufactured by ZEON CORPORATION) was used, and by cutting, a microchannel before merging and after branching was produced to be 200 μm wide, 400 μm deep and 10 mm long, and the microchannel 5 after merging be 400 μm wide, 400 μm deep and 80 mm long. As the third base material 13, a plastic substrate (55 mm wide×80 mm high×1 mm thick) made of cyclic olefin (ZEONEX 480, manufactured by ZEON CORPORATION) was used, and by cutting, through holes for the inlet 4 and the outlet 6 were produced and a length (height) reaching the bottom of the outlet reservoir was produced as the open channel 7 in the shape of penetrating the substrate being 1 mm wide and 1 mm deep. The above cutting substrates were bonded together by thermo-compression bonding, to produce a microfluidic device with the channel design shown in FIG. 2. The manufactured microfluidic device was shown in FIG. 7.

Oxygen plasma treatment was implemented as surface treatment, resulting in that a contact angle of the substrate with respect to water was 60 degrees.

A sample obtained by mixing water-base black ink in pure water was introduced from a right-side sample inlet in the microfluidic device, while pure water was introduced as a sample from a left-side sample inlet, and 2 ml each of the samples was introduced into the inlet reservoir. The fluid stably flew in the outlet reservoir in about 20 minutes, and the fluid was observed in the branch section 12 of the microchannel, leading to observation that the pure water and the pure water sample mixed with the black ink flew in a laminar-flow state and were then branched (the observation result is shown in FIG. 8). Further, a transparent liquid was recovered in the left-side outlet reservoir, and the black ink was not mixed therein.

Example 3

As the first base material 1, an acrylic substrate (55 mm wide×80 mm high×8 mm thick) was used, and by cutting, the sample inlet 2 was produced to be 25 mm wide and 10 mm high, the inlet reservoir 3 be 25 mm wide, 20 mm high and 8 mm deep, the sample recovery port 9 be 25 mm wide and 10 mm high, and the outlet reservoir 8 be 25 mm wide, 20 mm high and 8 mm deep. Further, as the second base material 10, a PMMA substrate (55 mm wide×80 mm high×1 mm thick) was used, and by cutting, a microchannel before merging was produced to be 300 μm wide, 200 μm deep and 5 mm long, the microchannel 5 after merging be 600 μm wide, 200 μm deep and 80 mm long, and each microchannel after branching into three be 200 μm wide, 200 μm deep and 5 mm long. As the third base material 13, a PMMA substrate (55 mm wide×80 mm high×1 mm thick) was used, and by cutting, through holes for the inlet 4 and the outlet 6 were produced and a length (height) reaching the bottom of the outlet reservoir was produced as the open channel 7 in the shape of penetrating the substrate being 2 mm wide and 1 mm deep. The above cutting substrates were bonded together by thermo-compression bonding, to produce a microfluidic device with the channel design shown in FIG. 3.

A sample obtained by mixing water-base red ink in pure water was introduced from a right-side sample inlet in the microfluidic device, while a sample obtained by mixing water-base blue ink in pure water was introduced as a sample from a left-side sample inlet, and 2 ml each of the samples was introduced into the inlet reservoir. The fluid stably flew in the outlet reservoir in about 30 minutes. When the fluid was observed in the branch section 12 of the microchannel, it was observed that the sample mixed with the red ink in a right-side microchannel, the sample mixed with the blue ink in a left-side microchannel, and the sample mixed with the red ink and the sample mixed with the blue ink in a central microchannel were flowing in the laminar-flow state.

Example 4

As the first base material 1, a plastic substrate (55 mm wide×80 mm high×6 mm thick) made of cyclic olefin (ZEONEX 480, manufactured by ZEON CORPORATION) was used, and by cutting, the sample inlet 2 was produced to be 25 mm wide and 10 mm high, the inlet reservoir 3 be 25 mm wide, 20 mm high and 6 mm deep, the sample recovery port 9 be 25 mm wide and 10 mm high, and the outlet reservoir 8 be 25 mm wide, 20 mm high and 6 mm deep. Further, as the second base material 10, a plastic substrate (55 mm wide×80 mm high×1 mm thick) made of cyclic olefin (ZEONEX 480, manufactured by ZEON CORPORATION) was used, and by cutting, a microchannel before merging and after branching was produced to be 200 μm wide, 400 μm deep and 10 mm long, and a microchannel after merging be 400 μm wide, 400 μm deep and 80 mm long.

As the third base material 13, a plastic substrate (55 mm wide×80 mm high×1 mm thick) made of cyclic olefin (ZEONEX 480, manufactured by ZEON CORPORATION) was used, and by cutting, through holes for the inlet 4 and the outlet 6 were produced and a length (height) reaching the bottom of the outlet reservoir was produced as the open channel 7 in the shape of penetrating the substrate being 1 mm wide and 1 mm deep.

As the fourth base material 14, a plastic substrate (55 mm wide×80 mm high×1 mm thick) made of cyclic olefin (ZEONEX 480, manufactured by ZEON CORPORATION) was used, and by cutting, a microchannel before merging and after branching was produced to be 200 μm wide, 400 μm deep and 15 mm long, and a microchannel after merging be 400 μm wide, 400 μm deep and 80 mm long.

As the fifth base material 15, a plastic substrate (55 mm wide×80 mm high×1 mm thick) made of cyclic olefin (ZEONEX 480, manufactured by ZEON CORPORATION) was used, and by cutting, a microchannel before merging and after branching was produced to be 200 μm wide, 400 μm deep and 20 mm long, and a microchannel after merging be 400 μm wide, 400 μm deep and 80 mm long. The above cutting substrates were bonded together by thermo-compression bonding, to produce a microfluidic device with the channel design shown in FIG. 4.

Oxygen plasma treatment was implemented as surface treatment, resulting in that a contact angle of the substrate with respect to water was 60 degrees.

A sample obtained by mixing water-base black ink in pure water was introduced from a right-side sample inlet in the microfluidic device, while pure water was introduced as a sample from a left-side sample inlet, and 2 ml each of the samples was introduced into the inlet reservoir. The fluid stably flew in the outlet reservoir in about 8 minutes. When the fluid was observed in the branch section 12 of the microchannel, it was observed that the pure water and the pure water sample mixed with the black ink flew in a laminar-flow state and were then branched. Further, a transparent liquid was recovered in the left-side outlet reservoir, and the black ink was not mixed therein.

Example 5

As the first base material 1, a plastic substrate (55 mm wide×80 mm high×6 mm thick) made of cyclic olefin (ZEONEX 480, manufactured by ZEON CORPORATION) was used, and by cutting, the sample inlet 2 was produced to be 25 mm wide and 10 mm high, the inlet reservoir 3 be 25 mm wide, 20 mm high and 6 mm deep, the sample recovery port 9 be 25 mm wide and 10 mm high, and the outlet reservoir 8 be 25 mm wide, 20 mm high and 6 mm deep. Further, as the second base material 10, a plastic substrate (55 mm wide×80 mm high×1 mm thick) made of cyclic olefin (ZEONEX 480, manufactured by ZEON CORPORATION) was used, and by cutting, 1-mmϕ each of five through holes were produced as the inlets 4, and eight lengths (heights) reaching the bottom of the outlet reservoir were produced as the open channels in the shape of penetrating the substrate being 1 mm wide and 1 mm deep.

As the third base material 13, a plastic substrate (55 mm wide×80 mm high×1 mm thick) made of cyclic olefin (ZEONEX 480, manufactured by ZEON CORPORATION) was used, and by cutting, 1-mmφ of a through hole was produced as the inlet 4 for introducing a sample fluid to the distribution channel 17, 0.5-mmφ each of four through holes were produced as through holes for distribution from the distribution channels 17 to the microchannels 5, 0.5-mmφ each of four through holes were produced as through holes for introducing the sample fluid from the microchannels 5 to the bypass channels, four 0.5 mmφ each of four through holes were produced as through holes for introducing the sample fluid from the bypass channels 18 to the pressure loss adjustment channels 16, four microchannels were produced as the microchannels 5 each including a microchannel before merging being 300 μm wide, 200 μm deep and 4 mm long, a microchannel after branching being 300 μm wide, 200 μm deep and 1 mm long, and a microchannel after merging being 600 μm wide, 200 μm deep and 8 mm long, and eight pressure loss adjustment channels 16 each being 0.1 mm wide, 0.2 mm deep and 22.5 mm long were produced.

As the fourth base material 14, a plastic substrate (55 mm wide×80 mm high×1 mm thick) made of cyclic olefin (ZEONEX 480, manufactured by ZEON CORPORATION) was used, and by cutting, the distribution channel 17 was produced to be 500 μm wide, 500 μm deep and 21.5 mm long, and the bypass channel 18 was produced to be 500 μm wide, 500 μm deep and 23 mm long.

Figure 9:
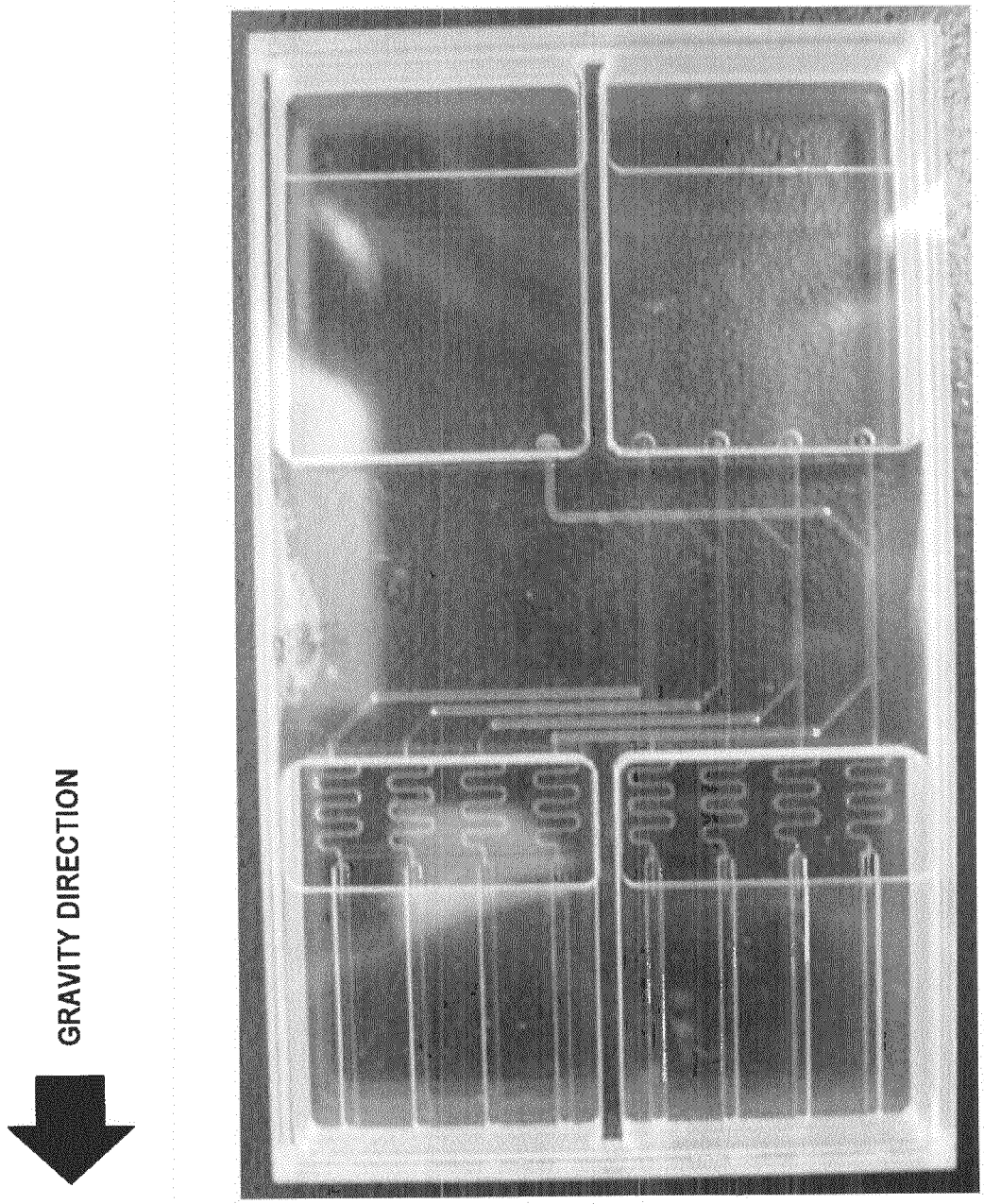
FIG. 9 is a schematic view showing a microfluidic device in the design of FIG. 5 produced in Example 5.

The above cutting substrates were bonded together by thermo-compression bonding, to produce a microfluidic device with the channel design shown in FIG. 5. The manufactured microfluidic device was shown in FIG. 9.

Argon plasma treatment was implemented as surface treatment, resulting in that a contact angle of the substrate with respect to water was 55 degrees.

A sample obtained by mixing water-base black ink in pure water was introduced from a right-side sample inlet in the microfluidic device, while pure water was introduced as a sample from a left-side sample inlet, and 2 ml each of the samples was introduced into the inlet reservoir. The fluid stably flew in the outlet reservoir in about 30 minutes. When the fluid was observed in the branch section 12 of the microchannel, it was observed that the pure water and the pure water sample mixed with the black ink flew in a laminar-flow state and were then branched. Further, a transparent liquid was recovered in the left-side outlet reservoir, and the black ink was not mixed therein.

Example 6

By use of the microfluidic device produced in Example 5, a fluid mixed with 5-μm polystyrene particles was allowed to flow as a sample fluid, the microfluidic device is inclined as in FIG. 10, and polystyrene beads inside the microchannel 5 were shot by a video camera, to calculate a movement rate. The movement rates of the polystyrene beads with respect to the angle of inclination being 10, 30, 60 and 90 degrees were 1, 3, 5 and 6 mm/sec, respectively, and hence, inclining the microfluidic device enabled adjustment of the flow rate of the fluid.

Comparative Example 1

A microfluidic device was produced without a change as compared with the microfluidic device described in Example 2, except that the open channel was not provided, but a through hole was provided.

A sample obtained by mixing water-base black ink in pure water was introduced from a right-side sample inlet in the microfluidic device, while pure water was introduced as a sample from a left-side sample inlet, and 2 ml each of the samples was introduced into the inlet reservoir. A phenomenon was seen in the vicinity of the through hole of the outlet in which the fluid formed a pool, and then ran down when the pool had a certain size, and hence the fluid was not flowing stably in the outlet reservoir. When the fluid was observed at a branch point of the microchannel, it was observed that the pure water and the pure water sample mixed with the black ink were flowing while pulsing, and that a fluid mixed with the black ink was mixed in the left-side outlet reservoir.

While the embodiments of the present invention have been described above, the present invention was not limited to these, and can take a variety of forms. Hereinafter, such forms will be listed.

(1) a microfluidic device, which includes an inlet, an outlet, a microchannel, an inlet reservoir and an outlet reservoir, each communicating with one another, and is used when the inlet is arranged at a higher position in a gravity direction than the outlet, and a fluid is allowed to flow with a hydraulic head difference due to gravity acting as driving force, the device having an open channel which communicates with the outlet, and part of the side surface of which is opened to the outside atmosphere.

(2) The microfluidic device described in (1), wherein a terminal of the open channel reaches the lowest point of the outlet reservoir.

(3) The microfluidic device described in (1) or (2), having a pressure loss adjustment channel for adjusting a flow rate of a fluid between the inlet and the open channel.

(4) The microfluidic device described in anyone of (1) to (3), wherein a contact angle of a surface of the microchannel with respect to water is equal to or less than 60 degrees.

(5) The microfluidic device described in any one of (1) to (4), wherein the surface of the microchannel is subjected to any treatment of plasma treatment, corona discharge treatment, and surface coating treatment with a hydrophilic polymer.

(6) The microfluidic device described in any one of (1) to (5), wherein the surface of the microchannel is treated by coating with any of polyethylene glycols (PEG), EVAL (EVOH), POVAL (PVOH) and a hydrophilic polymer having as a component a polymer with a phosphorylcholine group.

(7) The microfluidic device described in any one of (1) to (6), wherein a sectional shape of the microchannel has a width equal to or larger than 1 μm and equal to or smaller than 1 mm, and a depth equal to or larger than 1 μm and equal to or smaller than 1 mm.

(8) The microfluidic device described in any one of (1) to (7), wherein a base material of the microfluidic device is made up of plastic.

(9) The microfluidic device as described in any one of (1) to (8), wherein a plurality of microchannels are provided in a multilayer structure.

(10) The microchannel described in any one of (1) to (8), wherein a plurality of microchannels are placed in parallel.

(11) The microfluidic device described in any one of (1) to (10), having two or more each of the inlets, the outlets, the microchannels, the inlet reservoirs, and the outlet reservoirs.

(12) The microfluidic device described in any one of (1) to (11), wherein a bioactive substance containing at least one of a nucleic acid, a protein, a sugar chain, and a glycoprotein is fixed or included in part of the microchannel.

(13) A method for using a microfluidic device, wherein, by use of the microfluidic device described in any one of (1) to (12), two or more kinds of fluids are brought into contact, thereby to perform reaction, detection, extraction, separation, condensation or selection.

(14) A method for using a microfluidic device, wherein the microfluidic device described in any one of (1) to (12) is placed in an inclined manner so as to have an angle of inclination with respect to a horizontal direction, and then used.

DESCRIPTION OF REFERENCE NUMERALS 1 first base material of microfluidic device
2 sample inlet
3 inlet reservoir
4 inlet
5 microchannel
6 outlet
7 open channel with its side surface opened to the atmosphere
8 outlet reservoir
9 sample recovery port
10 second base material of microfluidic device
11 channel merging section
12 channel branching section
13 third base material of microfluidic device
14 fourth base material of microfluidic device
15 fifth base material of microfluidic device
16 pressure loss adjustment channel
17 distribution channel
18 bypass channel

The invention claimed is:

1. A microfluidic device, comprising:
a microchannel which is closed from an outside atmosphere, and is configured to transport a sample liquid;
an inlet reservoir which is configured to reserve the sample liquid to be introduced into the microchannel;
an inlet which is positioned on a sample-introduced side of the microchannel and communicates with the inlet reservoir;
an outlet which is positioned on a sample-discharged side opposite of the sample-introduced side of the microchannel;
an open channel which is different from the microchannel, is communicating with the outlet of the microchannel, and has a side surface opened to the outside atmosphere;
an outlet reservoir which is communicating with the open channel and is configured to reserve the sample liquid discharged from the open channel; and
a sample recovery port which is configured to recover the sample liquid from the outlet reservoir,
wherein the inlet is positioned at a higher position in a gravity direction than the outlet, the open channel has the side surface extended in the gravity direction such that the sample liquid is flown out of the outlet and is guided along with the side surface and removed from the outlet of the microchannel, and
the open channel has a terminal which reaches the lowest point of the outlet reservoir such that the sample liquid is configured to flow from the outlet toward the terminal of the open channel such that the sample liquid is reserved in the outlet reservoir.

2. The microfluidic device according to claim 1, further comprising a pressure loss adjustment channel which adjusts a flow rate of the sample liquid and is positioned between the inlet and the open channel.

3. The microfluidic device according to claim 1, wherein the microchannel is formed in a plurality, and the plurality of microchannels are formed in parallel.

4. The microfluidic device according to claim 2, wherein each of the inlet, the outlet, the microchannel, the inlet reservoir, the outlet reservoir and the pressure loss adjustment channel is formed in a plurality.

5. The microfluidic device according to claim 1, wherein a sectional shape of the microchannel has a width equal to or larger than 1 µm and equal to or smaller than 1 mm, and a depth equal to or larger than 1 µm and equal to or smaller than 1 mm.

6. The microfluidic device according to claim 1, wherein a contact angle of a surface of the microchannel with respect to water is equal to or less than 60 degrees.

7. The microfluidic device according to claim 1, wherein the microchannel has a surface subjected to one of plasma treatment, corona discharge treatment, and surface coating treatment with a hydrophilic polymer.

8. The microfluidic device according to claim 1, wherein the microchannel has a coated surface treated by coating with one of polyethylene glycols, EVAL, POVAL and a hydrophilic polymer having as a component a polymer with a phosphorylcholine group.

9. The microfluidic device according to claim 1, wherein the microfluidic device comprises a plastic base material.

10. The microfluidic device according to claim 2, wherein the inlet, the outlet, the microchannel, the inlet reservoir, the outlet reservoir and the pressure loss adjustment channel are formed in a multilayer structure comprising a plurality of base materials.

11. The microfluidic device according to claim 1, wherein the microchannel has a bioactive substance fixed on the microchannel and comprising at least one selected from the group consisting of a nucleic acid, a protein, a sugar chain, and a glycoprotein.

12. A method for bringing a plurality of fluids into contact, comprising:
introducing a plurality of fluids into the microfluidic device according to claim 1 such that the plurality of fluids goes through reaction, detection, extraction, separation, condensation or selection.

13. A method for transporting a fluid, comprising:
introducing a fluid into the microfluidic device according to claim 1; and
placing the microfluidic device according to claim 1 in an inclined manner so as to have an angle of inclination with respect to a horizontal direction.

14. The microfluidic device according to claim 1, wherein the microchannel has a bioactive substance comprising at least one selected from the group consisting of a nucleic acid, a protein, a sugar chain, and a glycoprotein.

15. A method for bringing a plurality of fluids into contact, comprising:
introducing a plurality of fluids into the microfluidic device according to claim 4 such that the plurality of fluids goes through reaction, detection, extraction, separation, condensation or selection.

16. A method for transporting a plurality of fluids, comprising:
introducing a plurality of fluids into the microfluidic device according to claim 4; and
placing the microfluidic device according to claim 4 in an inclined manner so as to have an angle of inclination with respect to a horizontal direction.

17. A microfluidic device, comprising:
an inlet reservoir configured to reserve a sample liquid;
a microchannel which is closed from an outside atmosphere, communicating with the inlet reservoir, and having an inlet on a sample-introduced side and an outlet on a sample-discharged side opposite to the sample-introduced side;

an open channel which is different from the microchannel, is communicating with the outlet of the microchannel, and has a side opened to the outside atmosphere and extended in a gravity direction such that the sample liquid discharged from the outlet of the microchannel is guided along with the open channel and removed from the outlet;

an outlet reservoir communicating with the open channel through the side of the open channel such that the outlet reservoir is configured to reserve the sample liquid discharged from the open channel; and a sample recovery port which is configured to recover the sample liquid from the outlet reservoir, wherein an end of the open channel is disposed to reach the bottom of the outlet reservoir.

18. The microfluidic device according to claim 17, wherein the microchannel is formed in a plurality, and the plurality of microchannels are formed in parallel.

19. The microfluidic device according to claim 1, wherein the open channel has a width of 10 μm or larger and 3 mm or smaller, and a depth of 10 μm or larger and 3 mm or smaller.

20. The microfluidic device according to claim 1, wherein the open channel has a width of 20 μm or larger and 2 mm or smaller, and a depth of 20 μm or larger and 2 mm or smaller.

\* \* \* \* \*